United States Patent [19]

Coussot et al.

[11] 4,257,021

[45] Mar. 17, 1981

[54] ELASTIC SURFACE WAVE FILTER

[75] Inventors: Gérard Coussot; Olivier Menager; Michel Van Den Driessche, all of Paris, France

[73] Assignee: Thomson-CSF, Paris, France

[21] Appl. No.: 45,923

[22] Filed: Jun. 6, 1979

[30] Foreign Application Priority Data

Jun. 6, 1978 [FR] France ............................. 78 16868

[51] Int. Cl.³ .................. H03H 9/68; H03H 9/42; H03H 9/64; H03H 9/25

[52] U.S. Cl. .................................... 333/195; 330/301; 333/153; 333/154; 333/196

[58] Field of Search .......................... 333/150-155, 333/193-196; 329/117, 118, 145, 193, 198, 207; 331/107 A; 330/301; 310/313

[56] References Cited

U.S. PATENT DOCUMENTS 3,626,309  12/1971  Knowles ............................. 329/117
4,160,219  7/1979  Kuny ................................. 333/194 X

FOREIGN PATENT DOCUMENTS 2138105  12/1972  France .
1427226  3/1976  United Kingdom ..................... 333/194
1433398  4/1976  United Kingdom .

OTHER PUBLICATIONS

Tancrell, "Improvement of an Acoustic Surface Wave Filter with a Microstrip Coupler", Electronic Letters, Jul. 12, 1973, pp. 316-317.

Marshall et al., "Surface Acoustic Wave Multistrip Components and their Applications", in IEEE Trans. on Microwave Theory and Techniques, vol. MTT-21, No. 4, Apr. 1973, pp. 216-225.

Primary Examiner—Marvin L. Nussbaum
Attorney, Agent, or Firm—Cushman, Darby & Cushman

[57] ABSTRACT

An elastic surface wave filter including on the surface of a plate, an emitting transducer, a surface wave coupler, and means for receiving the waves radiated by the coupler. The means for receiving includes two transducers each having two terminals with one terminal of each being in common with one terminal of the other. The common terminal serves as a phase reference and the voltages induced at the remaining terminals are in phase opposition to one another in the transmission band of the filter.

6 Claims, 5 Drawing Figures

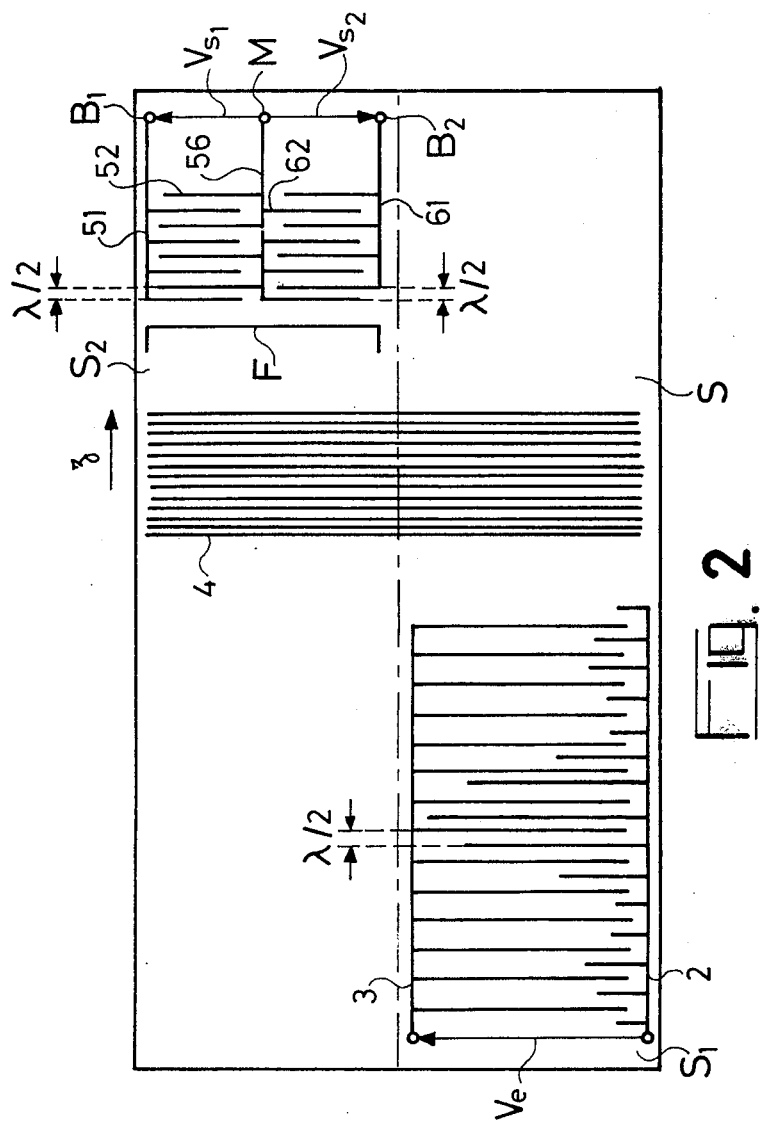

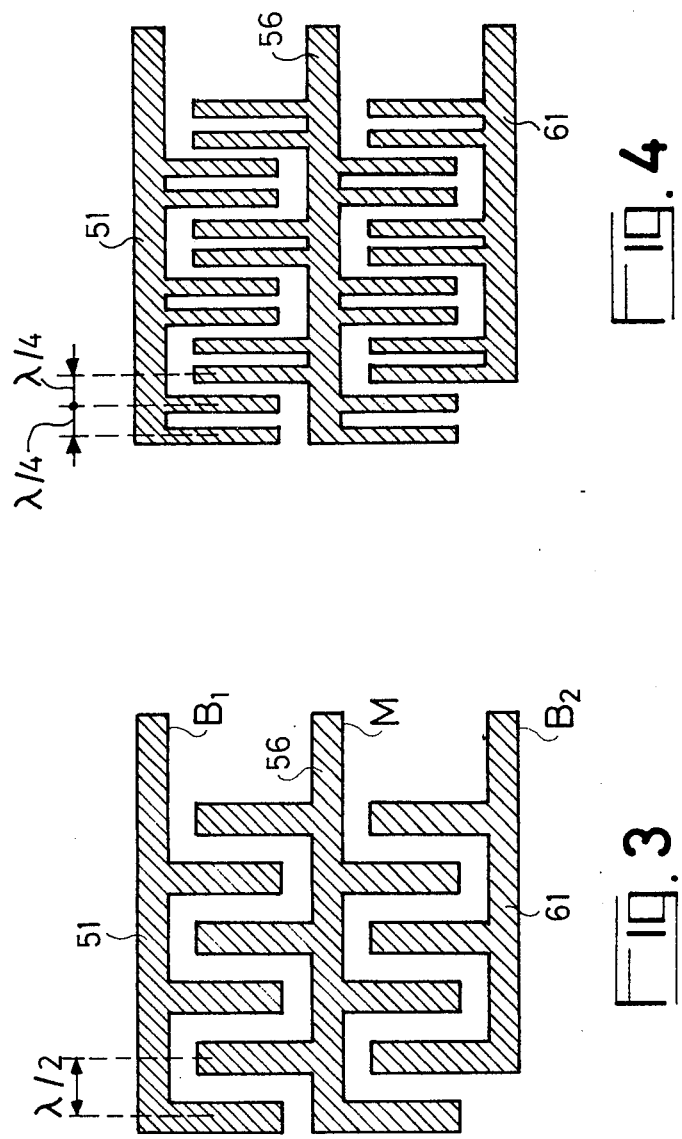

ELASTIC SURFACE WAVE FILTER

FIELD OF THE INVENTION

The invention relates to elastic surface wave filters provided on a piezoelectric plate and used, in particular, in the field of television.

DESCRIPTION OF THE PRIOR ART

A known method of filtering an electric signal of a given pass-band is to provide a delay line by placing on a piezoelectric plate two transducers, each of these being formed of two interdigitated combs. One of the two transducers receives the electric signal, which causes elastic surface waves to be emitted in the piezoelectric material. The other transducer picks up these waves and supplies an electric voltage whose complex amplitude depends on the pattern of the combs. In order to obtain the desired filtering range, the length of the fingers is selected so as to obtain for the emitting transducer a weighting that can be likened to the Fourier transform of the desired transfer function. It is also a known method, for the purpose of eliminating the unwanted signals resulting from the propagation of volume waves at the same time as the surface waves, to place between the emitting and the receiving transducers an elastic surface wave coupler formed of conductive filaments providing maximum coupling of the surface waves and zero coupling of the volume waves.

In the application concerning the filtering of the intermediate frequency signals transmitted by the video amplification channel, the ends of the two combs constituting the receiving transducer of the filter are connected to amplifier circuits generally having differential inputs. As the filter output is floatingly earthed, sensitivity problems arise, leading to interference affecting the demodulation signals.

SUMMARY OF THE INVENTION

An object of the invention is an improvement to surface wave filters whereby these problems can be overcome. The output transducer having two terminals without any phase reference is replaced by two transducers having a common comb with double rows of fingers and providing three output terminals, one being used as an earth in relation to which the voltages received at the other two are in phase opposition.

BRIEF DESCRIPTION OF THE DRAWINGS

The invention will be more readily appreciated by means of the following description and the accompanying drawings, wherein:

FIG. 2 represents a filter according to the invention.

FIGS. 3 and 4 are details of the pattern of the output transducers.

DESCRIPTION OF A PREFERRED EMBODIMENT

Figure 1:
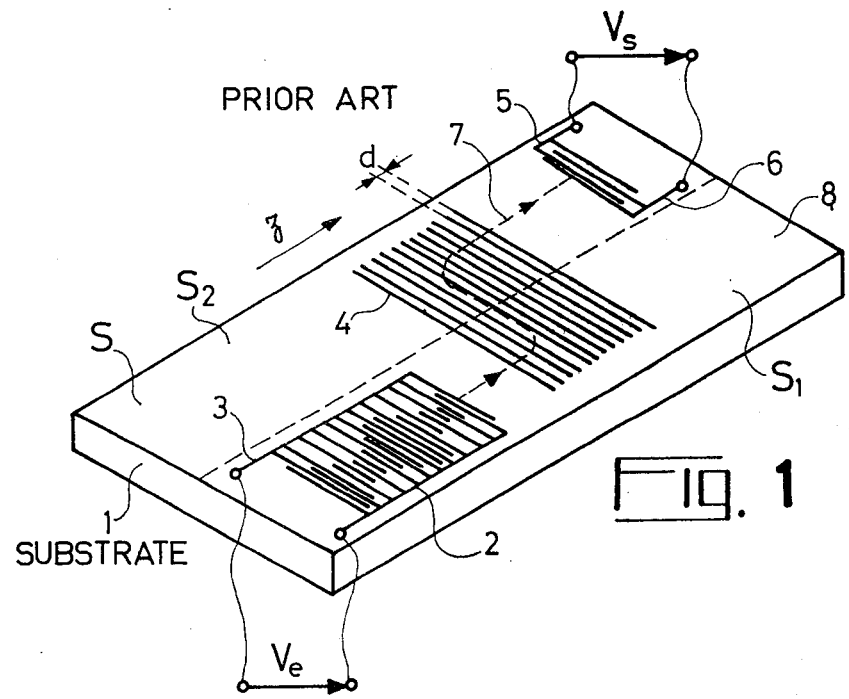
FIG. 1 represents an elastic surface wave filter of a known type.

FIG. 1 shows an elastic surface wave filter of a known type. It comprises a plate, 1, made of a piezoelectric material. On one of the faces, S, of the plate are deposited transducers formed by thin conductive stripes: an elastic surface wave emitting transducer in the form of two interdigitated combs, 2 and 3, to the ends of which can be applied an energizing signal $V_e$ generating elastic waves in the surface S and a receiving transducer, also in the form of two interdigitated combs, 5 and 6, between which can be received a signal $V_s$ corresponding to the signal $V_e$ with a delay depending on the propagation velocity of the elastic waves and on the propagation length. The surface S being divided into two halves, $S_1$ and $S_2$, separated by an imaginary line parallel to the direction of propagation z, the input transducer is located in the half $S_1$ and the output transducer in the half $S_2$.

Between the two transducers is placed an elastic surface wave coupler constituted by conductive filaments, 4, the number and spacing, d, of which are selected as a function of the elastic wavelength in such a way that the surface waves from the input transducer are totally reemitted by the coupler towards the output transducer, while the path of the volume waves is not modified by the coupler, so that they do not reach the receiving transducer and do not, therefore, create unwanted signals. Experimentally, one obtains a surface wave transmission efficiency of nearly 100% with approximately 110 filaments spaced apart by approximately half the wavelength of an elastic wave. The path, 7, followed by the surface waves is symbolically represented. The portion of this path 7 parallel to the filaments does not correspond strictly to the real path but illustrates the displacement in the path of the surface waves between the portion located upstream of the coupler 4 and the portion situated downstream.

In order to provide a pass-band filter with the surface wave device represented in FIG. 1, it is necessary to select a particular pattern for the combs 2 and 3 of the emitting transducer. It can be seen from the figure that the fingers of the combs are not equal in length and that their envelope takes the form: sin x/x. It is known that the pulse response of such a transducer also takes the form: sin x/s and the frequency response, which is the Fourier transform of the pulse response, has the almost square form of a band-pass filter. The interval between fingers determines the centre frequency of the pass-band of the filter: this is $\lambda/2$, $\lambda$ being the wavelength of the elastic waves propagated. The number of fingers in combs 2 and 3 determines the width of said pass-band. The latter will be wider the smaller the number of fingers. However, this number must be sufficient to define several lobes of the function sin x/x in order to obtain as square a frequency response as possible. The number of fingers of combs 2 and 3 is generally around one hundred, while the number of fingers of combs 5 and 6 can be far smaller, for example about ten. The particular form of the input transducer appropriate for the filtering range desired leads to the emission of waves having a considerably distorted wave front, the intensity not being equally distributed over the full width of zone $S_1$. The coupler restores in zone $S_2$ waves having a uniformly distributed wave front.

In certain of its applications, a band-pass filter such as the one in FIG. 1 has a serious drawback: the output does not have a phase reference; when a device with differential inputs, for example a differential amplifier is connected to this output, one can observe malfunctioning of this device and parasitic signals. It would be preferably to apply to the two differential inputs of the device to be connected voltages that are in phase opposition and of equal intensity but of opposite polarities in respect of the earth of said device. Now, the known types of surface wave filter do not have a structure supplying such signals. The invention consists in modifying the filter in FIG. 1 in such a way as to have three output terminals: one terminal that can be connected to the earth of the device, constituting a phase reference, and two symmetrical terminals, that is to say receiving voltages that are in phase opposition in relation to the reference terminal. A top view of the filter according to the invention is shown in FIG. 2. Some elements are the same as in FIG. 1 and these bear the same reference numbers. The filter according to the invention comprises, on surface S of a piezoelectric plate, an emitting transducer formed by two interdigitated combs, 2 and 3, the form of whose fingers describes a curve sin x/x. This transducer is located in the $S_1$ half of surface S. Behind the emitting transducer are placed conductive filaments 4 extending over the entire width of the plate and constituting the surface wave coupler whose object has been described above. This coupler supplies in the $S_2$ half of surface S elastic surface waves possessing a square wavefront whose intensity is uniformly distributed such as that, F, schematically represented in the figure. The means receiving these waves consist of two transducers with interdigitated combs: two combs with a single row of fingers, 51 and 61, and a comb 56 with two rows of fingers, 52 and 62, the fingers of the two rows 52 and 62 being respectively interleaved with the comb 51 to form a first transducer, and with the comb 61 to form the second transducer. Comb 56 is connected to an earthing terminal M. Combs 51 and 61 are respectively connected to terminals $B_1$ and $B_2$. The fingers are arranged parallel to the wave front F, normal to the direction of propagation z. The distance between a finger of one of the combs 51 and 61 and the closest finger of the corresponding row of fingers of comb 56 is constant and equal to half a wavelength. In the direction of propagation z, the first finger of comb 51 is located in the projection of the first finger of row 62. In the same way, the first finger of comb 61 is located in the projection of the first finger of row 52, at half a wavelength from the preceding ones. Thus, the electric field $E_1$ set up in the first transducer formed by the rows of fingers 51 and 52 and the electric field $E_2$ set up in the second transducer formed by the rows of fingers 61 and 62 by an incident elastic wave are of equal intensity and in opposite directions. At the output, a voltage $V_{S1}$ is obtained between terminals M and $B_1$ and a voltage $V_{S2}$ between terminals M and $B_2$. These voltages are equal and in phase opposition over the entire pass band of the filter. This effect is due on one hand, to the fact that the coupler which supplies waves with uniformly distributed intensity and, on the other hand, to the particular pattern of the fingers of the three combs 51, 56, 61.

The emitting transducer, the coupler and the two output transducers can be produced using conventional photolithographic processes. The exact form of the emitting transducer can have various alternative forms of embodiment which form part of the state of the art. The exact form of the output transducers can also vary. Two patterns are represented in FIGS. 3 and 4 as way as examples. In FIG. 3, it is a "conventional" pattern. The fingers of combs 51, 56, 61 are constituted by metallic stripes (hatched) in the figure), with the half-wavelength distance between two consecutive fingers shared more or less equally between the metallized portion the the non-metallized interval. The fingers forming part of one and the same comb are connected to the same metallic stripe whose end forms the terminals $B_1$, M and $B_2$.

In FIG. 4, it is a "split-fingers" pattern. Each finger is constituted by two metallic stripes (hatched) separated by a non-metallized interval. The distance between two stripes is equal to a quarter of a wavelength shared more or less equally between the metallized portion and the non-metallized portion. The distance between two consecutive fingers of two different combs remains half a wavelength for the two transducers. This pattern makes it possible to eliminate the unwanted signals from the elastic waves reflected on the metallic stripes. With the pattern in FIG. 3, the waves reflected by all the fingers are in phase and are added. With the pattern in FIG. 4, they are in phase opposition and destroy each other.

An elastic surface wave filter according to the invention applies, in particular, to the reception of television signals.

Figure 5:
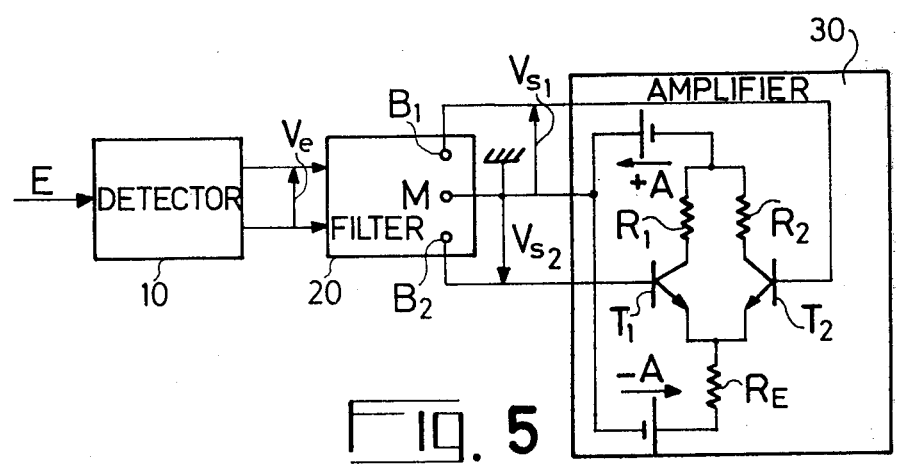
FIG. 5 is a circuit diagram showing an application of the invention.

FIG. 5 is a diagram of a part of the intermediate frequency stage of a television receiver. This stage receives an I.F. signal E. A video detector, 10, extracts from signal E a voltage Ve containing information relating to luminance and chrominance. This voltage is applied to the input of the band-pass filter 20 of the type described above, that is to say the elastic surface wave type with symmetrical outputs.

This filter enables the frequency band of the image channel to be extracted. A demodulator preceded by an amplifier is connected to the output of the filter. The amplification and demodulation functions can be performed by one and the same integrated circuit, 30, of the TBA 440, TBA 1440, TDA 4420, TBA 2541 . . . type.

The figure shows the first stage of a differential amplifier and illustrates the input of one of these integrated circuits in order to make clear the manner in which the filter according to the invention is connected up with any device having differential inputs. This stage includes two transistors, $T_1$ and $T_2$, whose emitters are interconnected and supplied with a d.c. voltage $-A$ negative in relation to the earth of circuit 30 via a common resistor, $R_E$ and whose collectors are supplied by a d.c. voltage $+A$ positive in relation to the earth, and via respectively resistors $R_1$ and $R_2$. The inputs of circuit 30 are the bases of transistors $T_1$ and $T_2$. They are respectively connected to the output terminals $B_1$ and $B_2$ of filter 20, while the earth of circuit 30 is connected to terminal M of filter 20. As already seen, the voltages applied to the two bases are always of the same value but of opposite signs and in phase opposition in relation to earth.

What we claim is:
1. An elastic surface wave filter comprising:
a piezoelectric plate of which one of the faces is divided into a first and a second halves by an imaginary line parallel to a direction z,
an emitting transducer located in said half and emitting elastic surface waves in said direction z,
receiving means located in said second half for converting elastic energy into electric energy, and
a coupler extending over said two halves, interposed between said emitting transducer and said receiving means and directing the elastic surface waves emitted by said emitting transducer towards said receiving means;
said receiving means comprising two transducers each having a first and a second terminal, the first terminals of said two transducers being common, the voltages between the first and second terminals induced by a surface wave, being of equal amplitude and in phase opposition in the transmission band of the filter.

2. A filter as claimed in claim 1, wherein said emitting transducer is composed of at least two interdigitated combs having fingers of unequal lengths to the terminals of which is applied an electric signal; said emitting transducer transmitting only the electric signal whose frequency is comprised between two pre-determined frequencies.

3. A filter as claimed in claim 2, wherein said receiving means are composed of two combs with a single row of fingers whose ends respectively form said second terminals and one comb with a double rows of fingers whose end forms said first common terminals; the fingers of said single row combs being respectively interleaved with the fingers of the two rows of said double rows comb.

4. A filter according to claim 3, wherein the fingers of all the combs forming part of said receiving means are of equal length.

5. A filter as claimed in claim 3, wherein the space between the fingers of the combs is constant, the distance between one finger of a comb and the closest finger of the interdigitated comb being equal to half of the wavelength of the elastic surface waves propagated.

6. A filter as claimed in claim 1, wherein said coupler is formed of conductive filaments deposited on said face normal to said direction z.

* * * * *